United States Patent
Anthony et al.

(10) Patent No.: US 7,115,461 B2
(45) Date of Patent: *Oct. 3, 2006

(54) HIGH PERMITTIVITY SILICATE GATE DIELECTRIC

(75) Inventors: John Mark Anthony, McKinney, TX (US); Scott R. Summerfelt, Garland, TX (US); Robert M. Wallace, Richardson, TX (US); Glen D. Wilk, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/015,604

(22) Filed: Dec. 17, 2004

(65) Prior Publication Data

US 2005/0112827 A1    May 26, 2005

Related U.S. Application Data

(63) Continuation of application No. 09/116,138, filed on Jul. 15, 1998, now Pat. No. 6,841,439.

(60) Provisional application No. 60/053,661, filed on Jul. 24, 1997, provisional application No. 60/053,616, filed on Jul. 24, 1997, provisional application No. 60/053,617, filed on Jul. 24, 1997.

(51) Int. Cl.
*H01L 21/8238*    (2006.01)

(52) U.S. Cl. .................. 438/216; 438/287; 438/591; 438/763; 257/E21.625

(58) Field of Classification Search ............ 438/216, 438/287, 591, 763, FOR. 177, FOR. 202; 257/E21.625
See application file for complete search history.

(56) References Cited

U.S. PATENT DOCUMENTS 3,875,476 A    4/1975    Crandall et al. .............. 317/98

(Continued)

FOREIGN PATENT DOCUMENTS

JP    56-73451    6/1981    ................. 257/310

(Continued)

OTHER PUBLICATIONS

Manchanda et al., "Gate Quality Doped High K Films for CMOS Beyond 100nm: 3-10nm Al2O3 With Low Leakage and Low Interface States", IEEE/IEE Electron Devices Meeting, *IEDM '98 Technical Digest*, pp. 605-608.

(Continued)

*Primary Examiner*—Michelle Estrada
(74) *Attorney, Agent, or Firm*—David Denker; W. James Brady; Frederick J. Telecky, Jr.

(57)    ABSTRACT

A field effect semiconductor device comprising a high permittivity silicate gate dielectric and a method of forming the same are disclosed herein. The device comprises a silicon substrate 20 having a semiconducting channel region 24 formed therein. A metal silicate gate dielectric layer 36 is formed over this substrate, followed by a conductive gate 38. Silicate layer 36 may be, e.g., hafnium silicate, such that the dielectric constant of the gate dielectric is significantly higher than the dielectric constant of silicon dioxide. However, the silicate gate dielectric may also be designed to have the advantages of silicon dioxide, e.g. high breakdown, low interface state density, and high stability. The present invention includes methods for depositing both amorphous and polycrystalline silicate layers, as well as graded composition silicate layers.

20 Claims, 3 Drawing Sheets

U.S. PATENT DOCUMENTS

| | | | | |
|---|---|---|---|---|
| 3,895,966 | A | 7/1975 | MacDougall et al. | 148/1.5 |
| 4,054,989 | A | 10/1977 | Ho et al. | 29/571 |
| 4,060,710 | A | 11/1977 | Reuter et al. | 219/548 |
| 4,147,615 | A | 4/1979 | Leas | 208/9 |
| 4,227,944 | A | 10/1980 | Brown et al. | 148/6 |
| 4,328,082 | A | 5/1982 | Neti et al. | 204/195 |
| 4,421,947 | A | 12/1983 | Kyle | 174/152 |
| 4,432,035 | A | 2/1984 | Hsieh et al. | 361/322 |
| 4,543,271 | A | 9/1985 | Peters | 427/54.1 |
| 4,621,277 | A | 11/1986 | Ito et al. | 357/54 |
| 4,952,992 | A | 8/1990 | Blanchard | 357/23.4 |
| 5,053,917 | A | 10/1991 | Miyasaka et al. | 361/321 |
| 5,098,623 | A | 3/1992 | Pompe | 264/65 |
| 5,173,835 | A | 12/1992 | Cornett et al. | 257/310 |
| 5,182,232 | A | 1/1993 | Chhabra et al. | 437/200 |
| 5,187,636 | A | 2/1993 | Nakao | 361/313 |
| 5,227,320 | A | 7/1993 | Johnson et al. | 437/44 |
| 5,504,041 | A | 4/1996 | Summerfelt | 437/235 |
| 5,528,068 | A | 6/1996 | Ohmi | 257/410 |
| 5,621,681 | A | 4/1997 | Moon | 365/145 |
| 5,665,966 | A | 9/1997 | Dahl et al. | 250/281 |
| 5,677,015 | A | 10/1997 | Hasegawa | 427/576 |
| 5,686,748 | A | 11/1997 | Thakur et al. | 257/310 |
| 5,773,325 | A | 6/1998 | Teramoto | 438/151 |
| 5,834,353 | A | 11/1998 | Wu | 438/287 |
| 5,834,357 | A | 11/1998 | Kang | 438/396 |
| 5,851,896 | A | 12/1998 | Summerfelt | 438/396 |
| 5,851,921 | A | 12/1998 | Gardner et al. | 438/655 |
| 5,874,766 | A | 2/1999 | Hori | 257/411 |
| 5,876,788 | A | 3/1999 | Bronner et al. | 427/81 |
| 5,880,006 | A | 3/1999 | Lin et al. | 438/424 |
| 5,923,056 | A | 7/1999 | Lee et al. | 257/192 |
| 6,013,553 | A | 1/2000 | Wallace et al. | 438/287 |
| 6,020,243 | A | 2/2000 | Wallace et al. | 438/287 |
| 6,291,866 | B1 | 9/2001 | Wallace et al. | 257/410 |
| 6,291,867 | B1 | 9/2001 | Wallace et al. | 257/410 |
| 6,841,439 | B1 | 1/2005 | Anthony et al. | 438/216 |

FOREIGN PATENT DOCUMENTS

| | | | | |
|---|---|---|---|---|
| JP | | 63-58959 | 3/1988 | 257/310 |

OTHER PUBLICATIONS

Shimada et al., "Current Drive Enhancement by Using High-Permittivity Gate Insulator in SOI MOSFET's and Its Limitation", *IEEE Trans. El. Devices*, 43/3, 1996, pp. 431-435.

Shimada et al., "*Minimum Parasitic Resistance for Ultra-Thin SOI MOSFET With High-Permittivity Gate Insulator Performed by Lateral Contact Structure*", Proc. 1995 IEEE International SOI Conference, pp. 98-99.

Chatterjee et al., "CMOS Metal Replacement Gate Transistors Using Tantalum Pentoxide Gate Insulator", IEEE Electron Device Meeting, *IEDM '98 Technical Digest*, pp. 777-780.

*Device Electronics for Integrated Circuits*, 2nd Edition, Richard S. Muller, Theodore I. Kamins; John Wiley & Sons, Chapter 8, "*Properties of the Metal-Oxide-Silicon System*", pp. 378-388.

*The Biographical Dictionary of Scientists*, 3rd edition,, vol. 1, Oxford University Press, NY copyright 1984/1985 pp. 120-121.

Yongjoo et al., "Effect of Barrier Layer on the Electrical and Reliability Characteristics of High-K Gate Dielectric Films", IEEE Electron Devices Meeting, *IEDM '98 Technical Digest*, pp. 797-800.

Tseng et al., "Reduced Gate Leakage Current and Boron Penetration of 0.18 μm 1.5 V MOSFETs Using Integrated RTCVD Oxynitride Gate Dielectric", IEEE Electron Devices Meeting, *IEDM '98 Technical Digest*, pp. 793-796.

Liu, "Circuit Requirement and Integration Challenges of Thin Gate Dielectrics for Ultra Small MOSFETs", IEEE Electron Devices Meeting, *IEDM '98 Technical Digest*, pp. 747-750.

Madan S., "*DRAM Plate Electrode Bias Optimization for Reducing Leakage Current in UV-O3 and O2 Annealed CVD Deposited Ta2O5 Dielectric Films*", 1995 IEEE, pp. 1871-1873.

Wolf et al., "*Silicon Processing for the VLSI Era*", 1986 Lattice Press, vol. 1, pp. 388-396.

Ghandi S. "*VLSI Fabrication Principles*", John Wiley & Sons, Inc. 1994, pp. 539-545.

US 7,115,461 B2

HIGH PERMITTIVITY SILICATE GATE DIELECTRIC

RELATED PATENT APPLICATIONS

This application is a continuation of application Ser. No. 09/116,138, filed Jul. 15, 1998, now U.S. Pat. 6,841,439, which claims priority from the following U.S. provisional applications: No. 60/053,661, filed Jul. 24, 1997; No. 60/053,616, filed Jul. 24, 1997; and No. 60/053,617 filed, Jul. 24, 1997.

This invention is related to concurrently filed applications application Ser. No. 09/115,855, abandoned, and application Ser. No. 09/115,856, which are incorporated herein by reference.

FIELD OF THE INVENTION

This invention relates generally to semiconductor device structures and methods for forming such, and more specifically to such structures and methods related to gate dielectrics for field effect devices formed on integrated circuits.

BACKGROUND OF THE INVENTION

Semiconductor devices such as field effect transistors are common in the electronics industry. Such devices may be formed with extremely small dimensions, such that thousands or even millions of these devices may be formed on a single-crystal silicon substrate or "chip" and interconnected to perform useful functions in an integrated circuit such as a microprocessor.

Although transistor design and fabrication is a highly complex undertaking, the general structure and operation of a transistor are fairly simple. With reference to FIG. 1, a simplified field effect transistor is shown in cross-section. In a field effect transistor a portion of the substrate 100 near the surface is designated as the channel 120 during processing. Channel 120 is electrically connected to source 140 and drain 160, such that when a voltage difference exists between source 140 and drain 160, current will tend to flow through channel 120. The semiconducting characteristics of channel 120 are altered such that its resistivity may be controlled by the voltage applied to gate 190, a conductive layer overlying channel 120. Thus by changing the voltage on gate 190, more or less current can be made to flow through channel 120. Gate 190 and channel 120 are separated by gate dielectric 180; the gate dielectric is insulating, such that between gate 190 and channel 120 little or no current flows during operation (although "tunneling" current is observed with thin dielectrics). However, the gate dielectric allows the gate voltage to induce an electric field in channel 120, giving rise to the name "field effect transistor."

Generally, integrated circuit performance and density may be enhanced by "scaling", that is by decreasing the size of the individual semiconductor devices on a chip. Unfortunately, field effect semiconductor devices produce an output signal that is proportional to the width of the channel, such that scaling reduces their output. This effect has generally been compensated for by decreasing the thickness of gate dielectric 180, thus bringing the gate in closer proximity to the channel and enhancing the field effect.

As devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide; because such layers are formed literally from a few layers of atoms, exacting process control is required to repeatably produce such layers; uniformity of coverage is also critical because device parameters may change dramatically based on the presence or absence of even a single monolayer of dielectric material; and finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. This performance is often expressed as "equivalent oxide thickness": although the alternative material layer may be thick, it has the equivalent effect of a much thinner layer of silicon dioxide (commonly called simply "oxide"). Many, if not most, of the attractive alternatives for achieving low equivalent oxide thicknesses are metal oxides, such as tantalum pentoxide and barium strontium titanate.

Researchers have found formation of such metal oxides as gate dielectrics to be problematic. At typical metal oxide deposition temperatures, the oxygen ambient or oxygen-containing precursor required to form them tends to also oxidize the silicon substrate, producing an oxide layer at the interface between the substrate and the gate dielectric. The presence of this interfacial oxide layer increases the effective oxide thickness, reducing the effectiveness of the alternative gate dielectric approach. The existence of the interfacial oxide layer places an ultimate constraint on the performance of an alternative dielectric field effect device.

SUMMARY OF THE INVENTION

The present invention comprises a semiconductor device structure utilizing a metal silicate gate dielectric layer, and a method for making the same. With the present invention, a metal silicate gate dielectric may be formed with a dielectric constant substantially higher than that of either conventional thermal silicon dioxide or silicon nitride dielectrics, and thus the metal silicate dielectric layer may be made substantially thicker than a conventional gate dielectric with equivalent field effect. However, it is believed that the present invention largely avoids disadvantages, such as interfacial silicon dioxide formation and high interface state densities, that are found with conventional alternative dielectrics.

The present invention generally avoids the problems of other alternative dielectrics by employing an oxidized dielectric material comprising a significant amount of silicon, particularly at the silicon/dielectric interface. In one preferred embodiment, a graded silicate layer is formed, such that near the silicon interface the silicate layer has a large $SiO_2$ component, while the upper portion of the silicate layer has a large metal oxide component. Such a structure employs primarily $SiO_2$ bonding at the silicon interface, with resulting low interface state densities. However, the high atomic number metal included in the silicate layer can significantly increase the dielectric constant of the film. The present invention also provides for amorphous silicate gate dielectrics, which have dense microstructures and avoid many of the problems associated with grain boundaries in polycrystalline dielectrics.

In one aspect of the invention, a method of fabricating a semiconductor device is disclosed that comprises providing a single-crystal silicon substrate, forming a metal silicate dielectric layer on the substrate, and forming a conductive gate overlying the metal silicate dielectric layer. This method may comprise one of several methods for forming the metal silicate dielectric layer. For example, a metal may be deposited on a cleaned Si surface, annealed to form a silicide layer, and then oxidized. Or, metal may be deposited on the substrate in an oxidizing ambient, followed by annealing in an oxidizing ambient. Or, metal and silicon may both be deposited on the substrate in a manner otherwise similar to one of the preceding procedures.

In another aspect of the invention, an integrated circuit having a field effect device fabricated thereon is disclosed that comprises a single-crystal silicon semiconducting channel region, a metal silicate gate dielectric overlying this channel region, and a conductive gate overlying this gate dielectric. The gate dielectric may be either an amorphous or a polycrystalline film. The metal silicate may be, for example, zirconium silicate, cerium silicate, zinc silicate, thorium silicate, bismuth silicate, hafnium silicate, lanthanum silicate, tantalum silicate, or a combination of these materials. Preferably, the metal silicate layer has a graded composition comprising a relatively greater ratio of silicon to metal near the semiconducting channel region, as compared to the ratio of silicon to metal near the conductive gate.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

Figure 1:
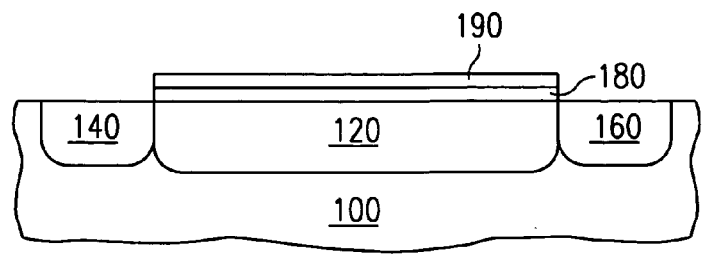
FIG. 1 is a cross-sectional view of a typical prior art integrated circuit field effect transistor.

The preferred embodiments of the invention may be fabricated using a representative Si(100) substrate, as described herein. The description of these embodiments begins, as shown if FIG. 2, after formation of an epitaxial layer 22 on substrate 20 and implantation of an active channel region 24 in epitaxial layer 22, and assumes that a protective or native silicon oxide region 26 (preferably comprising less than 1 nm of oxide) overlies channel 24 in the region of interest. Such a silicon oxide layer may be formed by heating a clean substrate to 600–700° C. for approximately 30 seconds, in an oxygen ambient of ~$10^{-3}$ Torr. Processes for reaching this step in fabrication are all well-known in the art, as are various equivalents to which the present invention is applicable. The examples below assume that the channel 24 is formed in epi-layer 22. However, the invention is equally applicable to gate dielectrics formed directly on substrate 20, or other relatively pure Si structures. In the descriptions below, layers 20 and 22, and region 24 will be used interchangeably, except where the context shows a particular item is meant.

Figure 3:
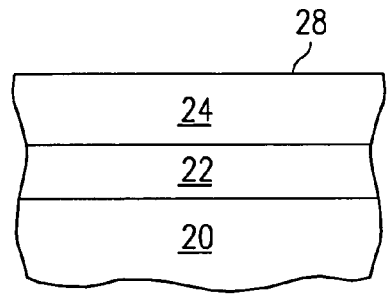
Figure 4:
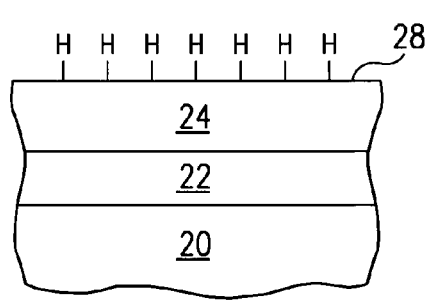

The particular embodiment employed for forming a silicate gate dielectric will dictate whether silicon oxide region 26 will be either left in place and used in the formation of the silicate layer, removed such that the underlying silicon may be used in the formation of the silicate layer, or removed and replaced with a passivation layer designed to inhibit interaction of the substrate in the metal silicate deposition process. The immediately following description relates to the preparation of the substrate for deposition of silicate-forming materials, and is applicable to the specific embodiments presented thereafter. There are two preferred starting surfaces for the invention if silicon oxide region 26 is to be removed. Region 26 may be removed so as to leave either a clean bare upper surface 28 as shown in FIG. 3, or a hydrogen-terminated surface as shown in FIG. 4. If oxide region 26 is removed, the bare surface is preferred to the hydrogen-terminated surface if chemical reaction of the highly reactive Si surface can be prevented, e.g. by processing in ultrahigh (less than ~$10^{-8}$ Torr) vacuum until a point in the particular process where exposure to oxygen can be tolerated. Otherwise, the bare Si surface should be terminated with a suitable passivant, such as hydrogen, which inhibits reoxidation and yet may be readily removed at an appropriate point in the process.

The method of oxide removal is not believed to be critical to the practice of the invention, as long as a clean, oxide-free surface can be maintained until an overlying deposition is performed. One preferred method of performing removal of oxide 26 is by exposure to wet HF, for example by dipping the substrate in dilute HF for 30 seconds and rinsing in deionized water. This both removes the native oxide and hydrogen terminates the surface. Another preferred method is by exposure to HF vapor; this provides similar results, but may be used, e.g., in a cluster tool to further prevent reoxidation or contamination of the surface. Either of these approaches may comprise other appropriate stripping chemicals, with HF or a $NH_4F$ solution being preferred as a last step to provide termination.

Several other methods produce a non-terminated surface 28, as shown in FIG. 3. One such method with particular applicability to cluster-tool practice is Si flux desorption; it has been found that below $10^{-8}$ Torr and at 780° C., an Si flux of preferably 1.5 Å/sec for about 600 seconds not only removes native oxide, but produces an atomically smooth, stepped surface that may have advantages for ultrathin gate dielectrics. The alternative is simple desorption by heating of the substrate to high temperature in vacuum or in an $H_2$ ambient; it is believed, however, that the Si-flux method results in a superior surface structure. In any of these methods, if the substrate is not to be kept in ultrahigh vacuum until an overlying deposition is completed, surface 28 may be hydrogen terminated, e.g. by exposure to atomic hydrogen produced by a plasma or hot filament in an $H_2$ ambient.

Surface 28 may also be passivated with an ultrathin layer, such as a silicon nitride or silicon oxynitride layer, that is not, strictly speaking, an oxide of silicon. Such layers act as a diffusion barrier and provide oxidation resistance to the substrate during formation of the overlying silicate layer. If an oxynitride layer is used, the preferred method of oxynitridation is by exposure to NO. Oxynitrides produced by other methods are not believed to provide sufficient oxidation resistance at the required thicknesses to complete some of the gate dielectric structures disclosed herein, and/or require higher process temperatures, and as such are not preferred. For instance, $N_2O$ processes result in a much smaller incorporation of N than NO processes. $NH_3$ processes require a pre-existing $SiO_2$ film, and thus a uniform sub-nanometer oxynitride film appears to be difficult to achieve using $NH_3$. Additionally, $NH_3$ annealing apparently incorporates undesirable hydrogen into the film structure.

Figure 5:
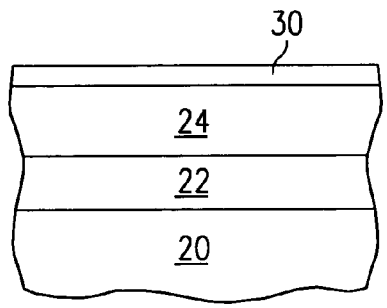

A typical NO process applicable to the present invention is as follows. The substrate is cleaned to remove the pad oxide. As a final step in the cleaning, the substrate is dipped in dilute HF for 30 seconds, and rinsed in deionized water. The substrate is then placed in a reaction chamber, which is then evacuated to $3\times10^{-8}$ Torr, and then the substrate is heated to 500° C. to remove the hydrogen passivation from the substrate surface. The substrate is heated to 700° C., and NO at 4 Torr is introduced into the chamber for 10 seconds to form the oxynitride passivation layer. FIG. 5 depicts a passivation layer 30, e.g., either an oxynitride or a nitride passivation layer.

Once the substrate has been prepared to provide either a clean Si surface, an oxide layer, or a protective barrier layer as described above, a metal silicate gate dielectric is formed on the substrate by one of several methods. Although the specific embodiments for gate dielectric formation described below may be readily adapted to the deposition of a wide range of metal silicate compositions and structures, the preferred metal silicate compositions and structures contain several properties as described below.

First, the metal silicate is preferably stable next to silicon. Appropriate silicates generally have a heat of formation that is more negative than the heat of formation of silicon dioxide, as this is believed to form a more stable gate structure and avoid the preferential formation of interfacial silicon dioxide. Some examples of these silicates are those of Ba, La, Hf, and the rare earth elements. Silicates with heat of formations close to that of $SiO_2$ (e.g. silicates of Sr, Y, Zr, Ta) may also be useful in the present invention, although stability of these silicates is generally less than that of silicates of the first group. Table 1 lists several candidates for this layer in order of heat of formation, with silicon dioxide included for comparison purposes.

TABLE 1

| Material | Heat of Formation (kcal/g/atom of O) |
| --- | --- |
| $Ca_3SiO_5$ | −138 |
| $Ca_2SiO_4$ | −135 |
| $Ba_2SiO_4$ | −124 |
| $CaSiO_3$ | −123 |
| $SrSiO_3$ | −123 |
| $Mg_2SiO_4$ | −122 |
| $Na_2SiO_3$ | −121 |
| $BaSiO_3$ | −120 |
| $MgSiO_3$ | −119 |
| $ZrSiO_4$ | −115 |
| $CeSiO_4$ | −115 |
| $SiO_2$ | −103 |

Second, it is preferred that the metal silicate have a high dielectric constant as compared to the dielectric constant of silicon dioxide (~4) or the dielectric constant of silicon nitride (~7). Generally, the dielectric constant of silicates increases with the atomic number of the metal included; higher atomic weight metals such as Ba, La, Hf, and the rare earth elements are therefore preferred.

Third, the silicate may be formed as either a polycrystalline or an amorphous film. Generally, polycrystalline films will have better dielectric constant. However, amorphous films generally have higher breakdown performance, form a better diffusion barrier, and have lower interface state densities. Also, with many of the preferred embodiments for formation of a silicate dielectric according to the present invention, formation of an amorphous film may be easier than formation of a polycrystalline film because of the uniform stoichiometry required for a polycrystalline film. Amorphous silicate films may also be stabilized by the inclusion of more than one metal in a mixed-metal silicate film.

Several metal silicates that address these preferences are zirconium silicate, cerium silicate, zinc silicate, thorium silicate, bismuth silicate, hafnium silicate, lanthanum silicate, tantalum silicate, and combinations thereof. The examples below will focus on zirconium silicate and hafnium silicate.

Finally, the present invention comprehends a graded dielectric composition. In a preferred embodiment, a silicate film may be formed where the ratio of silicon to metal varies as a function of depth in the film. For example, a graded silicate film may be formed that is mainly $SiO_2$ at the substrate interface (e.g. 2–10 mol % metal oxide), thus providing an interface with a quality similar to that obtained with pure $SiO_2$.

The ratio of silicon to metal is decreased with a grading profile that results preferably in a greater percentage of metal oxide near the top of the gate dielectric film.

Embodiment 1

In one embodiment according to the invention, a metal silicate gate dielectric is formed by depositing metal on a clean Si surface, annealing this structure to form a metal silicide, oxidizing the silicide layer, and annealing this structure. In this embodiment, a substrate such as shown in either FIG. 3 or FIG. 4 is used. If surface 28 is passivated as shown in FIG. 4, the substrate can be briefly heated to above 500° C. in vacuum or an inert ambient to remove the passivation.

Figure 6:
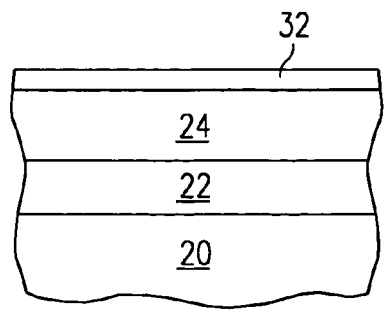
FIGS. 6–9 are cross-sectional views of a semiconductor device during fabrication according to one preferred embodiment of the invention.

Referring to FIG. 6, a metal layer 32 (e.g. zirconium or hafnium) is deposited directly on surface 28, e.g. by sputtering, evaporation, chemical vapor deposition (CVD) or plasma CVD. Sputter deposition is preferably done with a low-energy plasma system, such as collimated or long-throw sputtering; it should be noted that low deposition rates (e.g. on the order of a few angstroms per second) are preferred, as the total thickness to be deposited is small and uniformity is desired. For an 8" wafer, deposition may be completed in a system with a base pressure of $\sim10^{-8}$ Torr, an operating pressure of $\sim10^{-4}$ Torr, and a separation between the sputter gun and the wafer of 16 inches, and the wafer may be rotated to improve uniformity. Ar is an acceptable sputter gas, and the wafer may be maintained at a temperature of 400° C. during deposition.

As an alternative to sputtering, metal layer 32 may be deposited by evaporation from an e-beam source onto a substrate at 500° C., with a net deposition rate on the order of tenths of angstroms to a few angstroms per second. The substrate is preferably rotated to improve uniformity. Other alternative methods include CVD or plasma CVD using appropriate precursors, such as zirconium tetrachloride and hydrogen gas. Again, with these methods low deposition rates and temperatures (600° C. and lower) are preferred, and a downstream plasma type reactor is preferred to a reactor where the plasma is generated at the substrate.

Figure 7:
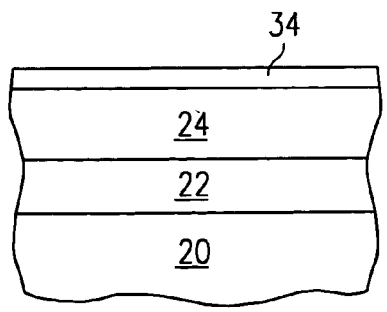

Referring to FIG. 7, a metal silicide layer 34 is formed by annealing substrate 20 with metal layer 32 in an inert ambient, a reducing ambient, or vacuum. Although exact values will depend on the metal selected and the thickness of silicide desired, a 20 second anneal at 700° C. in vacuum will generally suffice. During most silicide processes, silicon from substrate 20 diffuses into metal layer 32 to form metal silicide layer 34. It should be noted that with this technique, an excessively thick metal layer 32 may be deposited, such that less than the entire layer 32 is converted to silicide during the anneal. In this case, the thickness of the silicide is controlled by the anneal time, and the excess metal is etched away after the silicide anneal step.

Figure 8:
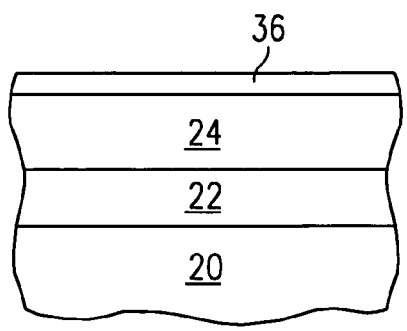

Referring now to FIG. 8, silicide layer 34 is converted to a silicate layer 36 by oxidation. Control of oxidation is critical during this step, as under-oxidation will result in decreased resistivity and over-oxidation may result in decreased capacitance for layer 36 (due to oxidation of the underlying silicon). Many oxygen anneal processes are available for this step, such as a low temperature $O_2$ anneal with or without ultraviolet exposure, or an activated oxygen anneal such as $O_3$, $O_3$ with ultraviolet exposure, a downstream $O_2$ plasma, $N_2O$, or a low temperature $O_2$ plasma with a DC-biased substrate. As an example of this last process, a downstream 1500 W ECR source operating at 1 mTorr, coupled with ~60V DC and 13.56 MHz or 300 kHz RF applied to the substrate may be used while He backside cooling at 80° C. is also applied to the substrate. Processing time is determined experimentally such that both resistivity and dielectric constant lie within an acceptable range.

Generally, a high temperature anneal of silicate layer 36 is selected to densify or crystallize the film after low temperature oxidation. For example, the substrate may be densified by annealing in Ar for 20 seconds at 750° C. This anneal may be done in either an inert or a reducing environment, with a reducing environment particularly useful where metal layer 32 was deposited by CVD using halogens. If a reducing environment is used, an additional low-temperature post-anneal in oxygen may be used to improve dielectric properties of silicate layer 36.

Figure 2:
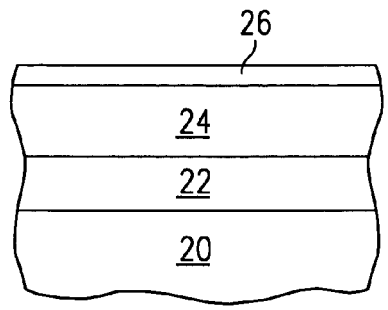
FIGS. 2–5 are cross-sectional views of several semiconductor devices, illustrating different surfaces appropriate for deposition of a silicate gate dielectric according to the invention.
Figure 9:
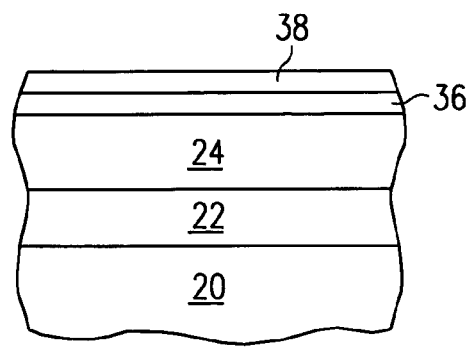

Finally, with reference to FIG. 9, conductive gate 38 is deposited over silicate gate dielectric 36. Processes for depositing gate 38 are well known in the art; gate 38 may be formed, by way of example, of doped polysilicon, metal, or a conductive metal oxide. As a variation on this embodiment, the silicide and oxidation steps may be combined, either by introducing an oxidizing ambient before the silicide is completely formed, or by completely overlapping the two steps. In this latter variation, a substrate such as that depicted in FIG. 2 is preferable, as silicon oxide layer 26 can supply both oxygen and silicon towards the formation of silicate layer 36.

Embodiment 2

In a second embodiment according to the invention, a metal silicate gate dielectric is formed by depositing metal on a substrate in an oxidizing ambient, followed by annealing. This embodiment preferably utilizes a substrate prepared by one of the methods corresponding to FIG. 2, 3, or 4, and the metal may be deposited by one of the methods described in Embodiment 1, with the following differences.

Figure 10:
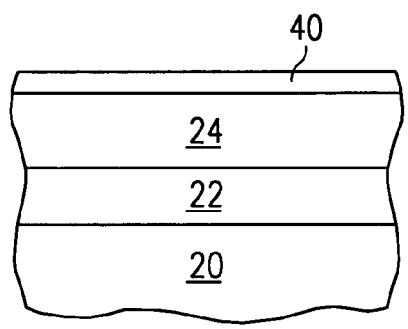
FIGS. 10–12 are cross-sectional views of a semiconductor device during fabrication according to a second preferred embodiment of the invention.

Referring to FIG. 10, an oxidized metal layer 40 may be deposited on a clean Si surface by sputtering as described above. However, some amount of controlled oxygen activity is used to at least partially oxidize layer 40 as metal is supplied to the substrate. For example, $O_2$ or $H_2O+H_2$ may be introduced near the substrate during sputtering with Ar, with an $O_2$ flow rate of about one-tenth that of the Ar flow rate. For a metal deposition rate of 0.1 nanometers per second, the oxidizing gas is preferably introduced from 0 to 5 seconds after the start of the deposition process.

If oxidized metal layer 40 is produced by the evaporation method, the oxidizer is preferably added near the substrate. To achieve near complete oxidation of the deposited metal, ~5–10 Torr of $O_2$ may be used for a metal deposition rate of 0.1 nm/sec. If a CVD method is used, appropriate precursors should provide the necessary oxygen (e.g. zirconium tetrachloride and water).

Figure 11:
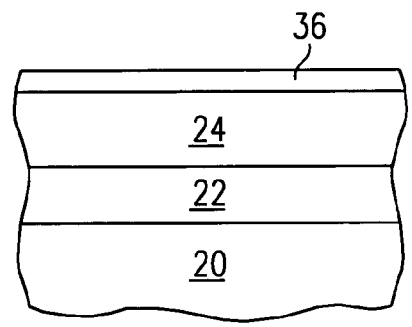

Referring to FIG. 11, layer 40 is reacted with the substrate to form metal silicate layer 36. Preferably, this is accomplished with a low-temperature oxygen anneal followed by a high temperature anneal, such as those described in the preceding embodiment. One example of a preferred oxygen anneal is a 400° C. anneal in $O_3$ for 60 seconds.

Figure 12:
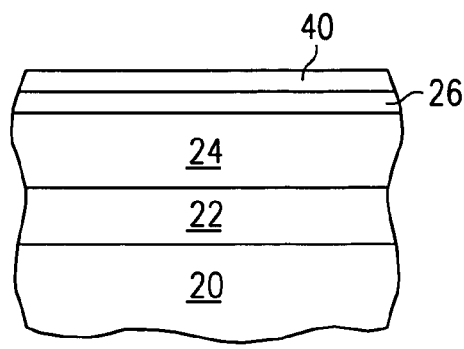

It should be noted that this embodiment may be readily tailored to produce a graded silicate layer. One variation on this method is shown in FIG. 12, wherein layer 40 is deposited over a silicon oxide layer 26. In such an embodiment, oxygen activity during the anneal may be reduced, and silicate layer 36 may be formed by "stealing" both oxygen and silicon from layer 26. The grading of the structure may be adjusted by adjusting the relative initial thicknesses of layers 26 and 40. It may also be appropriate to supply Si to layer 40 by implantation of energetic ions from a remote plasma, using DC bias on the substrate to adjust penetration depth. For example, silane may be used to implant Si into layer 40.

Embodiment 3

In a third embodiment according to the invention, a metal silicate gate dielectric is formed by depositing both metal and silicon on the substrate in an oxidizing ambient, followed by annealing. In this embodiment, the substrate preparation may be chosen as any of those shown in FIGS. 2–5. As this method generally does not rely on silicon from the substrate as a component of the silicate film, a surface that limits oxidation of the substrate, such as the diffusion barrier surface of FIG. 5, is preferred. The metal and silicon may be deposited by one of the methods described in Embodiment 1, with the following differences.

Figure 13:
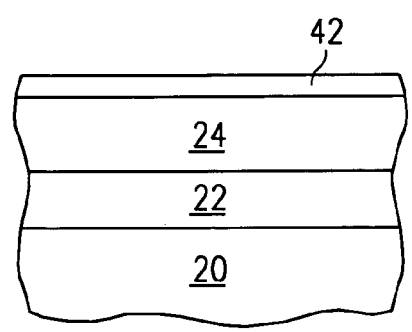
FIGS. 13–15 are cross-sectional views of a semiconductor device during fabrication according to a third preferred embodiment of the invention.

Referring to FIG. 13, an oxidized metal and silicon layer 42 may be deposited on a clean Si surface by sputtering as described in Embodiment 2 for the deposition of oxidized metal layer 40. The deposition of both metal and silicon is accomplished by replacing the metal target with an appropriate silicide target. The disadvantage of this method is that deposition of a graded layer from a single composition target is difficult.

If oxidized metal and silicon layer 42 is produced by the evaporation method, a method similar to that of Embodiment 2 may be selected. In this case, it is preferred that separate metal and silicon e-beam sources be used such that the ratio of silicon to metal may be varied during deposition.

If a CVD method is used, appropriate precursors should provide the necessary oxygen. Some combinations of precursors, such as a combination of silane, zirconium tetrachloride, and oxygen, may be used to produce uniform stoichiometry layers but may be difficult to use for a graded composition layers. For a graded layer, CVD precursors such as a combination of silicon tetrachloride, zirconium tetrachloride, and water are preferred.

Figure 14:
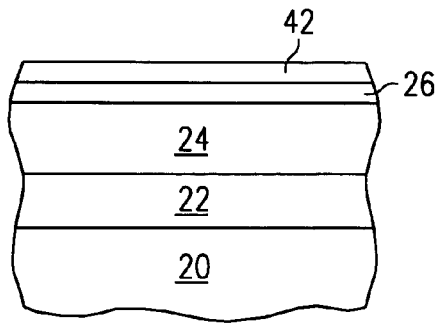
Figure 15:
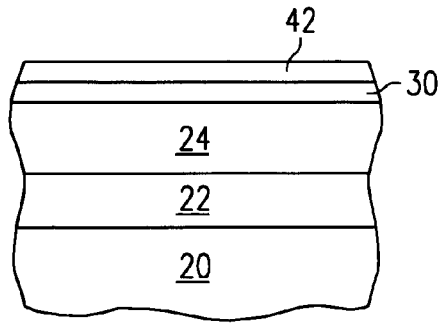

Formation of a high performance silicate layer using this process will generally require both a low-temperature oxygen anneal and a high temperature anneal such as those described in the preceding embodiments. FIGS. 14 and 15 depict, respectively, layer 42 deposited on a silicon oxide layer 26 and on a diffusion barrier layer 30 (e.g. a silicon oxynitride layer). As noted, the presence of the diffusion barrier layer 30 allows for the selection of a more aggressive oxygen anneal.

Embodiment 4

In a fourth embodiment according to the invention, a metal silicate dielectric is formed by depositing both metal and silicon on the substrate, followed by annealing. Silicates formed according to this embodiment may be formed on a substrate prepared according to FIG. 2, 3, 4, or 5. In its most straightforward form, this embodiment is a combination of the metal deposition/silicide technique of Embodiment 1 with the metal/silicon deposition sources of Embodiment 3, such that a silicide is deposited directly.

Figure 16:
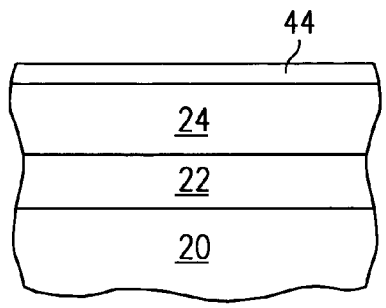
FIGS. 16–18 are cross-sectional views of a semiconductor device during fabrication according to a fourth preferred embodiment of the invention.

Referring to FIG. 16, a metal silicide layer 44 may be deposited on a clean Si surface by sputtering as described in Embodiment 1 for the deposition of metal layer 34. The deposition of both metal and silicon is accomplished by replacing the metal target with an appropriate silicide target. The disadvantage of this method is that deposition of a graded layer from a single composition target is difficult.

If metal silicide layer 44 is produced by the evaporation method, a method similar to that of Embodiment 1 may be selected. In this case, it is preferred that separate metal and silicon e-beam sources be used such that the ratio of silicon to metal may be varied during deposition.

If a CVD method is used, appropriate precursors should provide the necessary oxygen. Some combinations of precursors, such as a combination of silane and zirconium tetrachloride, may be used to produce uniform stoichiometry layers but may be difficult to use for a graded composition layers. For a graded layer, CVD precursors such as a combination of silicon tetrachloride, zirconium tetrachloride, and hydrogen are preferred. Excess hydrogen may be required to prevent the incorporation of chlorine into the film.

Formation of a high performance silicate layer 46 (FIG. 17) from layer 44 using this process will generally require both a low-temperature oxygen anneal and a high temperature anneal such as those described in the preceding embodiments, particularly Embodiment 1. As noted in the previous embodiment, the presence of a diffusion barrier layer 30 allows for the selection of a more aggressive oxygen anneal.

Embodiment 5

In a fifth embodiment according to the invention, a metal silicate dielectric is formed by depositing both a metal oxide and silicon on the substrate, followed by oxygen annealing. This approach sometimes works better than the silicide approaches above, since the deposited layer is not in a highly reduced (i.e. oxygen deficient) state, at least to the same degree as with the silicide intermediary approaches.

Silicates formed according to this embodiment may be formed on a substrate prepared according to FIG. 2, 3, 4, or 5.

Figure 19:
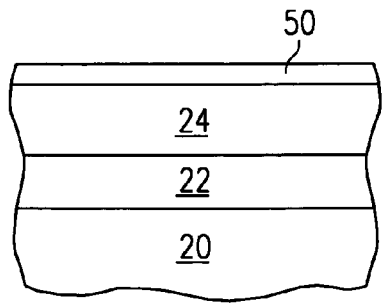
FIGS. 19–20 are cross-sectional views of a semiconductor device during fabrication according to a fifth preferred embodiment of the invention.
Figure 20:
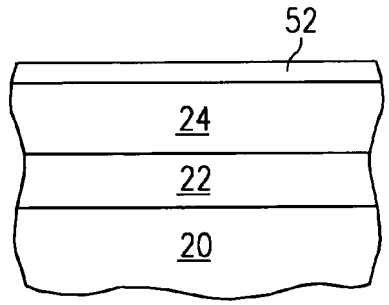

Referring to FIG. 19, a partially reduced metal silicate layer 50 may be deposited on a clean Si surface by co-sputtering a metal oxide, such as $ZrO_2$ and elemental Si, to form oxygen-deficient zirconium silicate. Alternatively, artisans may co-sputter $HfO_2$ and Si, to form oxygen-deficient hafnium silicate. Although this zirconium silicate is partially reduced, it may be more readily oxidized to a full silicate than zirconium silicide may be fully oxidized.

For an 8" wafer, deposition may be completed in a system with a base pressure of $\sim 10^{-8}$ Torr, an operating pressure of $\sim 10^{-3}$ Torr, and a separation between the sputter gun and the wafer of 16 inches, and the wafer may be rotated to improve uniformity. Ar or a mixture of Ar and $O_2$ ($O_2$ $\sim$10–50%) is an acceptable sputter gas, and the wafer may be maintained at a temperature of 400–500° C. during deposition. The RF power setting should be low, at about 50–100 watts, to avoid particle and defect formation. The Si power settings are not usually as important, thus they can be set the same as the $ZrO_2$ settings.

As an alternative to sputtering, a partially reduced metal silicate layer 50 may be deposited by evaporation from separate zirconium oxide and silicon e-beam sources onto a substrate at 500–600° C., with a net deposition rate on the order of tenths of angstroms to a few angstroms per second. The substrate is preferably rotated to improve uniformity.

Referring now to FIG. 8, partially reduced metal silicate layer 50 is converted to a silicate layer 52 by oxidation. Control of oxidation is critical during this step, as under-oxidation will result in decreased resistivity and over-oxidation may result in decreased capacitance for layer 52 (due to oxidation of the underlying silicon). Post-anneals in $O_2$ at about 400–550° for up to about 30 minutes generally increase capacitance while maintaining low leakage current. Anneals at higher temperatures or longer times tend to degrade capacitance. Many oxygen anneal processes are available for this step, such as a low temperature $O_2$ anneal, with or without ultraviolet exposure, or an activated oxygen anneal such as $O_3$, $O_3$ with ultraviolet exposure, a downstream $O_2$ plasma, $N_2O$, or a low temperature $O_2$ plasma with a DC-biased substrate. As an approximate example of this last process, a downstream 1500 W ECR source operating at 1 mTorr, coupled with $\sim$60V DC and 13.56 MHz or 300 kHz RF applied to the substrate may be used while He backside cooling at 80° C. is also applied to the substrate. Processing time is determined experimentally such that both resistivity and dielectric constant lie within an acceptable range.

Generally, a high temperature anneal of silicate layer 52 is selected to densify or crystallize the film after low temperature oxidation. For example, the substrate may be densified by annealing in Ar for 20 seconds at 750° C. This anneal may be done in either an inert, reducing or an oxidizing environment, with a reducing environment particularly useful where partially reduced metal silicate layer 50 was deposited by CVD using halogens. If a reducing environment is used, an additional low-temperature post-anneal in oxygen may be used to improve dielectric properties of silicate layer 52. For physical vapor deposited (PVD) dielectrics, an inert or oxidizing ambient is generally preferred. As noted in a previous embodiment, the presence of a diffusion barrier layer 30 allows for the selection of a more aggressive oxygen anneal. The independent introduction of the metal oxide, such as $ZrO_2$, and the silicon allows for direct control of a graded metal-to-silicon profile of the silicate dielectric.

We have found that, for gate dielectrics, it is not necessarily desirable to form exactly stoichiometric $ZrSiO_4$. Instead, it is sometimes preferable to form slightly Zr-rich or Zr-deficient films. Stoichiometric $ZrSiO_4$ will crystallize more easily, but non-stoichiometric films remain more stable in amorphous phases. Further, controlling the Zr-content allows control of the dielectric constant, as well as $SiO_2$-like interface properties. Oxygen-rich silicates seem to exhibit lower leakage currents and better interface properties, because a more $SiO_2$-like interface and film improves both.

In a variation of this embodiment, it is possible to make slight changes to the oxygen content of the partially reduced metal silicate layer 50. A slightly higher oxygen content can be obtained by substituting $SiO_2$ for the Si in either the sputtering or evaporation processes. This $SiO_2$ sputtering will form SiO, which will thus provide additional oxygen beyond the $ZrO_2$ and Si, yet not provide enough oxygen to form stoichiometric $ZrSiO_4$.

It is often desirable to form an only slightly reduced metal silicate layer. However, sometimes, it may be preferable to initially form a more reduced, but not fully reduced metal silicate layer 50. In these instances, the $ZrO_2$ can be replaced with Zr, while the Si is replaced by $SiO_2$. The resulting SiO provides the silicate with more oxygen than the silicide methods described above, but less than the $ZrO_2$/Si method of embodiment 5.

Embodiment 6

Figure 17:
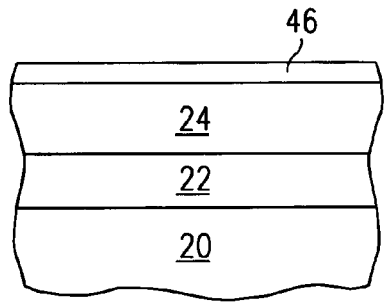
Figure 18:
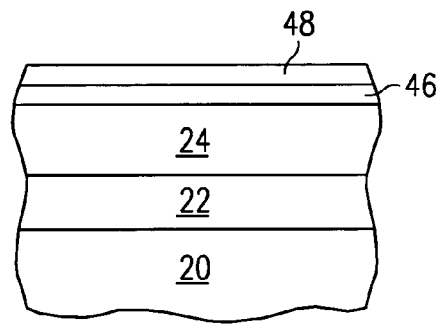

As an alternative to the preceding embodiments, it is recognized that some of the deposition steps described may be repeated to tailor the composition of a silicate layer. With reference to FIGS. 17 and 18, for example, layer 46 may form only an intermediate layer. For example, one or more monolayers of either silicon, metal, or a combination may be deposited using the e-beam evaporation method described in Embodiment 4, followed by a short anneal in an oxidizing ambient to produce intermediate layer 46. This may then be followed by deposition of a second intermediate layer 48 by a similar process, with the same or a different composition. Using this method, oxidized silicon and oxidized metal layers can be interleaved in an alternating fashion prior to a final anneal. Or, graded compositions can be deposited directly.

The present invention is not limited by the specific embodiments described herein. Although a particular substrate and type of device have been described herein for clarity, this invention has application to Si devices generally which modify the semiconducting characteristics of an active region using the field effect of an overlying conductive region. Various other combinations of the described steps may be used to produce silicate gate dielectrics, and such are intended to fall within the scope of this invention.

What is claimed is:

1. A method of fabricating a field-effect transistor for an integrated circuit, comprising the steps of:
    providing a single-crystal silicon substrate;
    forming a hafnium silicate dielectric layer on the substrate; and
    forming a conductive gate overlying the hafnium silicate dielectric layer.

2. An integrated circuit made by the method of claim 1.

3. The method of claim 1, wherein the forming a hafnium silicate dielectric layer step comprises:
    exposing a clean Si surface on the substrate;
    depositing hafnium on the Si surface;
    annealing the substrate in an inert ambient, thereby forming a layer of hafnium silicide on the substrate;
    oxidizing the layer of hafnium silicide, thereby forming the hafnium silicate dielectric layer.

4. The method of claim 3, further comprising oxidizing less than 1 nanometer of the clean Si surface prior to the depositing hafnium step.

5. The method of claim 3, wherein the oxidizing step comprises simultaneous exposure of the layer of hafnium suicide to an oxidizing gas and a reducing gas.

6. The method of claim 5, wherein the oxidizing gas is selected from the group consisting of $O_2$, $H_2O$, $N_2O$, $CO_2$, and combinations thereof.

7. The method of claim 5, wherein the reducing gas is selected from the group consisting of CO, $H_2$, $CH_3$, and combinations thereof.

8. The method of claim 3, wherein the oxidizing step comprises exposure of the layer of a suicide to an oxygen plasma.

9. The method of claim 8, wherein the oxygen plasma is exposed to ultraviolet radiation.

10. The method of claim 3, further comprising annealing the hafnium silicate layer in a non-oxidizing environment, thereby densifying the silicate layer.

11. The method of claim 1, wherein the forming a hafnium silicate dielectric layer step comprises:
    depositing hafnium on the substrate in an oxidizing ambient, thereby forming an at least partially oxidized layer on the substrate; and
    annealing the substrate in an oxidizing ambient.

12. The method of claim 11, wherein the substrate comprises an oxidized silicon surface layer immediately prior to the depositing step.

13. The method of claim 11, wherein the substrate comprises a clean Si surface immediately prior to the depositing step.

14. The method of claim 11, wherein the depositing hafnium step comprises sputtering material from a target of hafnium onto the substrate.

15. The method of claim 1, wherein the forming a hafnium silicate dielectric layer step comprises:
    depositing hafnium and silicon on the substrate in an oxidizing ambient, thereby forming an at least partially oxidized layer on the substrate; and
    annealing the substrate in an oxidizing ambient.

16. The method of claim 15, wherein the substrate comprises an oxidized silicon surface layer immediately prior to the depositing step.

17. The method of claim 15, wherein the substrate comprises a clean Si surface immediately prior to the depositing step.

18. The method of claim 15, wherein the depositing hafnium and silicon step comprises simultaneous deposition of a layer comprising hafnium and silicon.

19. The method of claim 18, wherein the simultaneous deposition comprises sputtering material from a target comprised of the hafnium and silicon onto the substrate.

20. The method of claim 18, wherein the simultaneous deposition comprises evaporating hafnium and silicon from separate sources.

* * * * *